(12) United States Patent
Saraswatula et al.

(10) Patent No.: US 10,901,391 B1
(45) Date of Patent: Jan. 26, 2021

(54) MULTI-SCANNING ELECTRON MICROSCOPY FOR WAFER ALIGNMENT

(71) Applicant: Carl Zeiss SMT GmbH, Oberkochen (DE)

(72) Inventors: Jagdish Chandra Saraswatula, Singapore (SG); Jens Timo Neumann, Aalen (DE); Philipp Huethwohl, Ulm (DE); Thomas Korb, Schwaebisch Gmuend (DE); Raghavendra Hanumantha Nayak, Pleasanton, CA (US)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 16/564,453

(22) Filed: Sep. 9, 2019

(51) Int. Cl.
   *G05B 19/402* (2006.01)
   *H01L 23/544* (2006.01)
   *G06T 7/00* (2017.01)

(52) U.S. Cl.
   CPC .......... *G05B 19/402* (2013.01); *G06T 7/0006* (2013.01); *G06T 7/0008* (2013.01); *H01L 23/544* (2013.01); *G05B 2219/45031* (2013.01); *G05B 2219/49113* (2013.01); *G06T 2207/10061* (2013.01); *G06T 2207/30148* (2013.01); *H01L 2223/54426* (2013.01); *H01L 2223/54493* (2013.01)

(58) Field of Classification Search
   CPC ........ G05B 19/402; G05B 2219/45031; G05B 2219/49113; G06T 7/0006; G06T 7/0008; G06T 2207/10061; G06T 2207/30148; H01L 23/544; H01L 2223/54426; H01L 2223/54493
   See application file for complete search history.

(56) References Cited

U.S. PATENT DOCUMENTS 10,199,316 B2  2/2019 Seddon et al.
10,199,330 B2  2/2019 Woerz et al.

OTHER PUBLICATIONS

Kim J., "New Wafer Alignment Process Using Multiple Vision Method for Industrial Manufacturing," Electronics 2018, 7, 39. https://doi.org/10.3390/electronics7030039.

*Primary Examiner* — Nicole M Ippolito
*Assistant Examiner* — Hanway Chang
(74) *Attorney, Agent, or Firm* — Fish & Richardson P.C.

(57) ABSTRACT

A method includes controlling a multi-scanning electron microscope, mSEM, to capture a first image of a wafer attached to a motorized handling stage while the motorized handling stage is in a first position. The first image includes at least a part of a notch of the wafer. The method also includes determining a radial axis of the wafer based on the first image, and controlling the motorized handling stage to shift the wafer along the radial axis by half a diameter of the wafer so that the motorized handling stage is in a second position. The method further includes controlling the mSEM to capture a second image of the wafer while the motorized handling stage is in the second position. The second image includes wafer structures. In addition, the method includes determining a reference position of the wafer based on a structure recognition of the wafer structures of the second image, and registering a wafer coordinate system of the wafer to a stage coordinate system of the motorized handling stage based on the reference position and the radial axis.

20 Claims, 6 Drawing Sheets

MULTI-SCANNING ELECTRON MICROSCOPY FOR WAFER ALIGNMENT

FIELD

The disclosure generally relates to techniques of wafer alignment including wafer alignment using multi-scanning electron microscopy.

BACKGROUND

In general, semiconductor structures are built with minimum structure sizes or critical dimensions of down to about 5 nanometers, and devices with smaller critical dimensions are being developed. The fabrication of such semiconductor structures may involve about 1000 fabrication steps, starting with a blank wafer, to form an array of semiconductor dies, each semiconductor die including the semiconductor structures. The fabrication steps can include, for example, about 100 lithography steps. In modern manufacturing lines, up to 200 wafers may pass each lithography step by hour.

Each semiconductor die and sometimes each semiconductor structure has a well-defined position within a wafer coordinate system. The wafer coordinate system defines the lateral positions on a flat surface of the wafer. The wafer coordinate system may be aligned with, for example, (i) a center or other central reference position of the wafer, and (ii) a notch of the wafer.

In order to obtain a high yield of semiconductor structures of close to 100%, it is typically desirable to closely monitor variations in any fabrication step that may indicate process variations leading to defects. Therefore, high-speed in-line metrology is used between different fabrication steps or is integrated into the fabrication steps. This metrology is sometimes also referred to as wafer inspection. Metrology tools are used to detect indications of process variations or defect candidates within a structure after specified fabrication step. Typical silicon wafers used in manufacturing of semiconductor structures have diameters of up to 12 inches (300 mm). With the small structure sizes, defect candidates of the order of the critical dimensions are desirably identified in a very large area in a short time.

For wafer inspection, usually some kind of image of the wafer surface is captured, using imaging modalities such as scanning electron microscopy (SEM) or x-ray diffraction. The field-of-view (FOV) of the imaging modalities in a defined arrangement with a motorized handling stage to which the wafer can be attached. Typically, such motorized handling stage has at least two or three or even more degrees of freedom (e.g., lateral displacement, vertical displacement, rotation, and tilt). The motorized handling stage can u) be positioned at a high accuracy, e.g., using closed-loop feedback control for any associated motion. The motion of the wafer handling stage is defined in a stage coordinate system associated with the motorized handling stage.

Thus, semiconductor wafer inspection is important for semiconductor process control and manufacturing. There are many steps and analysis types involved in defect monitoring and yield management services. Wafer inspection forms a component of this task. Since the features and defects are very small in dimension (~nanometers), it is desirable to have a good reference point for navigating—i.e., positioning the motorized handling stage—with the dies and the wafer. Wafer alignment is used to register the wafer coordinate system to the stage coordinate system. Such alignment can be used to create a wafer map which is a mapping between positions in the stage coordinate system and positions in the wafer coordinate system. Thus, wafer alignment and the creation of the wafer map form the basis of the diagnostics/characterization methods that follow. This is because a FOV of an imaging modality used for the wafer inspection is aligned within the stage coordinate system.

Performing the wafer alignment can be a time-consuming task. For example, often different microscopy techniques offering a wide variation of specifications in terms of (i) resolution and (ii) FOV are combined. Coarse alignment is typically used using a microscopy technique offering a wide FOV. Such microscopy using wide FOV can have limited resolution. A typical example is optical microscopy. Fine alignment is implemented using a further microscopy technique such as SEM, which offers a higher resolution, but is often limited in terms of the available FOV. Due to switching between two microscopy techniques, inaccuracies or translational shifts can be introduced which can make it difficult to complete the wafer alignment. In particular, the fields of view between multiple imaging modalities may not be aligned. Also, an orientation of the respective detector optics of the multiple imaging modalities with respect to the wafer may vary, for example, due to a non-uniaxial alignment. It may be desirable to capture multiple images for fine alignment in order to detect positioning markers. Due to the limited FOV of the microscopy technique used for the fine alignment, ambiguities in a repetitive arrangement of positioning markers or semiconductor structures can sometimes result in false results of the registering.

The following references are known: U.S. Pat. No. 10,199,330 B2 and U.S. Pat. No. 10,199,316 B2.

SUMMARY

The disclosure seeks to provide a wafer alignment method that mitigates at least some of the issues associated with known wafer alignment methods.

In a general aspect, the disclosure provides a method that includes controlling a multi-scanning electron microscope, mSEM, to capture a first image of a wafer. The wafer is attached to a motorized handling stage. The mSEM is controlled to capture the first image while the motorized handling stage is in a first position. The first image includes at least a part of a notch of the wafer. The method also includes determining a radial axis of the wafer based on the first image. The method further includes controlling the motorized handling stage to shift the wafer along the radial axis by half a diameter of the wafer; then, the motorized handling stage is in a second position. The method further includes controlling the mSEM to capture a second image of the wafer while the motorized handling stage is in the second position. The second image includes wafer structures. The method also includes determining a reference position of the wafer based on a structure recognition of the wafer structures of the second image. The method further includes registering a wafer coordinate system of the wafer to a stage coordinate system of the motorized handling stage based on the reference position and the radial axis.

In a general aspect, the disclosure provides a computer program or a computer-program product or a computer-readable storage medium that includes program code that can be executed by at least one processor. Executing the program code causes the at least one processor to perform a method. The method includes controlling a multi-scanning electron microscope, mSEM, to capture a first image of a wafer. The wafer is attached to a motorized handling stage. The mSEM is controlled to capture the first image while the motorized handling stage is in a first position. The first image includes at least a part of a notch of the wafer. The method also includes determining a radial axis of the wafer based on the first image. The method further includes controlling the motorized handling stage to shift the wafer along the radial axis by half a diameter of the wafer; then, the motorized handling stage is in a second position. The method further includes controlling the mSEM to capture a second image of the wafer while the motorized handling stage is in the second position. The second image includes wafer structures. The method also includes determining a reference position of the wafer based on a structure recognition of the wafer structures of the second image. The method further includes registering a wafer coordinate system of the wafer to a stage coordinate system of the motorized handling stage based on the reference position and the radial axis.

In a general aspect, a processing device includes control circuitry. The control circuitry is configured to control a multi-scanning electron microscope, mSEM, to capture a first image of a wafer attached to a motorized handling stage while the motorized handling stage is in a first position. The first image includes at least a part of a notch of the wafer. The control circuitry is further configured to determine a radial axis of the wafer based on the first image. The control circuitry is further configured to control the motorized handling stage to shift the wafer along the radial axis by half a diameter of the wafer, so that the motorized handling stage is in a second position. The control circuitry is further configured to control the mSEM to capture a second image of the wafer while the motorized handling stage is in the second position, the second image including wafer structures. The control circuitry is further configured to determine a reference position of the wafer based on a structure recognition of the wafer structures of the second image. The control circuitry is further configured to register a wafer coordinate system of the wafer to a stage coordinate system of the motorized handling stage based on the reference position and the radial axis.

In a general aspect, a method includes: controlling a multi-scanning electron microscope, mSEM, to capture a first image of a wafer attached to a motorized handling stage while the motorized handling stage is in a first position, the first image including at least a part of a notch of the wafer; determining a radial axis of the wafer based on the first image; controlling the motorized handling stage to shift the wafer along the radial axis by half a diameter of the wafer so that the motorized handling stage is in a second position; controlling the mSEM to capture a second image of the wafer while the motorized handling stage is in the second position, the second image including wafer structures; determining a reference position of the wafer based on a structure recognition of the wafer structures of the second image; and registering a wafer coordinate system of the wafer to a stage coordinate system of the motorized handling stage based on the reference position and the radial axis.

In a general aspect, a method, includes: controlling a multi-scanning electron microscope, mSEM, to capture a first image of a wafer attached to a motorized handling stage while the motorized handling stage is in a first position, the first image including at least a part of a notch of the wafer; determining a radial axis of the wafer based on the first image; controlling the motorized handling stage to shift the wafer along the radial axis so that the motorized handling stage is in a second position; controlling the mSEM to capture a second image of the wafer while the motorized handling stage is in the second position, the second image including wafer structures; determining a reference position of the wafer based on a structure recognition of the wafer structures of the second image; and registering a wafer coordinate system of the wafer to a stage coordinate system of the motorized handling stage based on the reference position and the radial axis. As an example, the method includes controlling the motorized handling stage to shift the wafer along the radial axis includes shifting the radial axis by less than a diameter of the wafer.

In a general aspect, one or more machine-readable hardware storage devices include instructions that are executable by one or more processing devices to perform operations comprising a method disclosed herein.

In a general aspect, a system, includes: one or more processing devices; and one or more machine-readable hardware storage devices comprising instructions that are executable by the one or more processing devices to perform operations a method disclosed herein.

It is to be understood that the features mentioned above and those yet to be explained below may be used not only in the respective combinations indicated, but also in other combinations or in isolation without departing from the scope of the disclosure.

DETAILED DESCRIPTION OF EMBODIMENTS

Some examples of the present disclosure generally provide for a plurality of circuits or other electrical devices. All references to the circuits and other electrical devices and the functionality provided by each are not intended to be limited to encompassing only what is illustrated and described herein. While particular labels may be assigned to the various circuits or other electrical devices disclosed, such labels are not intended to limit the is scope of operation for the circuits and the other electrical devices. Such circuits and other electrical devices may be combined with each other and/or separated in any manner based on the particular type of electrical implementation that is desired. It is recognized that any circuit or other electrical device disclosed herein may include any number of microcontrollers, a graphics processor unit (GPU), integrated circuits, memory devices (e.g., FLASH, random access memory (RAM), read only memory (ROM), electrically programmable read only memory (EPROM), electrically erasable programmable read only memory (EEPROM), or other suitable variants thereof), and software which co-act with one another to perform operation(s) disclosed herein. In addition, any one or more of the electrical devices may be configured to execute a program code that is embodied in a non-transitory computer readable medium programmed to perform any number of the functions as disclosed.

Implementations of the subject matter and the functional operations described in this specification can be implemented in digital electronic circuitry, in tangibly-embodied computer software or firmware, in computer hardware, including the structures disclosed in this specification and their structural equivalents, or in combinations of one or more of them. Implementations of the subject matter described in this specification can be implemented as one or more computer programs, i.e., one or more modules of computer program instructions encoded on a tangible program carrier for execution by, or to control the operation of, a processing device. Alternatively or in addition, the program instructions can be encoded on a propagated signal that is an artificially generated signal, e.g., a machine-generated electrical, optical, or electromagnetic signal that is generated to encode information for transmission to suitable receiver apparatus for execution by a processing device. A machine-readable medium can be a machine-readable storage device, a machine-readable storage substrate, a random or serial access memory device, or a combination of one or more of them.

The term "processing device" encompasses all kinds of apparatus, devices, and machines for processing information, including by way of example a programmable processor, a computer, or multiple processors or computers. The apparatus can include special purpose logic circuitry, e.g., an FPGA (field programmable gate array) or an ASIC (application specific integrated circuit) or RISC (reduced instruction set circuit). The apparatus can also include, in addition to hardware, code that creates an execution environment for the computer program in question, e.g., code that constitutes processor firmware, a protocol stack, an information base management system, an operating system, or a combination of one or more of them.

A computer program (which may also be referred to as a program, software, a software application, a script, or code) can be written in any form of programming language, including compiled or interpreted languages, or declarative or procedural languages, and it can be deployed in any form, including as a stand alone program or as a module, component, subroutine, or other unit suitable for use in a computing environment. A computer program may, but need not, correspond to a file in a file system. A program can be stored in a portion of a file that holds other programs or information (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable computers executing one or more computer programs to perform functions by operating on input information and generating output. The processes and logic flows can also be performed by, and apparatus can also be implemented as, special purpose logic circuitry, e.g., an FPGA (field programmable gate array) or an ASIC (application specific integrated circuit) or RISC.

Computers suitable for the execution of a computer program include, by way of example, general or special purpose microprocessors or both, or any other kind of central processing unit. Generally, a central processing unit will receive instructions and information from a read only memory or a random access memory or both. The essential elements of a computer are a central processing unit for performing or executing instructions and one or more memory devices for storing instructions and information. Generally, a computer will also include, or be operatively coupled to receive information from or transfer information to, or both, one or more mass storage devices for storing information, e.g., magnetic, magneto optical disks, or optical disks. However, a computer need not have such devices. Moreover, a computer can be embedded in another device, e.g., a mobile telephone, a smartphone or a tablet, a touch-screen device or surface, a personal digital assistant (PDA), a mobile audio or video player, a game console, a Global Positioning System (GPS) receiver, or a portable storage device (e.g., a universal serial bus (USB) flash drive), to name just a few.

Computer readable media (e.g., one or more machine readable hardware storage devices) suitable for storing computer program instructions and information include all forms of non volatile memory, media and memory devices, including by way of example semiconductor memory devices, e.g., EPROM, EEPROM, and flash memory devices; magnetic disks, e.g., internal hard disks or removable disks; magneto optical disks; and CD ROM and (Blue Ray) DVD-ROM disks. The processor and the memory can be supplemented by, or incorporated in, special purpose logic circuitry.

To provide for interaction with a user, implementations of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

Implementations of the subject matter described in this specification can be implemented in a computing system that includes a back end component, e.g., as an information server, or that includes a middleware component, e.g., an application server, or that includes a front end component, e.g., a client computer having a graphical user interface or a Web browser through which a user can interact with an implementation of the subject matter described in this specification, or any combination of one or more such back end, middleware, or front end components. The components of the system can be interconnected by any form or medium of digital information communication, e.g., a communication network. Examples of communication networks include a local area network ("LAN") and a wide area network ("WAN"), e.g., the Internet.

The computing system can include clients and servers. A client and server are generally remote from each other and typically interact through a communication network. The relationship of client and server arises by virtue of computer programs running on the respective computers and having a client-server relationship to each other. In another example, the server can be in the cloud via cloud computing services.

In the following, embodiments of the disclosure will be described in detail with reference to the accompanying drawings. It is to be understood that the following description of embodiments is not to be taken in a limiting sense. The scope of the disclosure is not intended to be limited by the embodiments described hereinafter or by the drawings, which are taken to be illustrative only.

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. A coupling between components may also be established over a wireless connection. Functional blocks may be implemented in hardware, firmware, software, or a combination thereof.

Hereinafter, techniques of wafer alignment are described. The techniques described herein facilitate generating a wafer map. The wafer map can be indicative of a mapping of (i) positions in a stage coordinate system of a motorized handling stage to (ii) positions in a wafer coordinate system associated with the wafer. The wafer map can be used in wafer inspection, e.g., to align one or more positions on the wafer with the FOV of an associated imaging modality.

According to the techniques described herein, a multi-scanning electron microscope (mSEM) can be used for the wafer alignment.

In particular, various examples are based on the finding that in reference implementations, the wafer alignment is a two-step process including, firstly, coarse alignment using an optical microscope, and, secondly, fine alignment using a scanning electron microscope. According to the various examples described herein, an mSEM can be used to complete the entire process for the wafer alignment and, thus, bypassing the coarse alignment using the optical microscope. The mSEM is an implementation of a charged-particle microscope. In an mSEM, the wafer is irradiated by an array of electron beams, including for example more than 40 or even more than 90 electron beams, as primary radiations. The beams are scanned together over the wafer to jointly form an image of a large area of the wafer. Per scanning position, the multiple beams are used to obtain images. This provides for a large FOV. The image is formed based on secondary particles or radiations emitted from the wafer in response to the irradiation with a primary radiation, i.e. the electron beams. The secondary radiation may be in the form of secondary electrons, backscattered electrons, x-rays, and/or luminescence radiation. The composition, energy and angle of the secondary radiation can be controlled by the energy of the primary radiation and is an indication of the material composition and surface quality of the wafer surface scanned. With an mSEM, a fast scanning of a wafer surface is possible, and therefore, it is well suitable for wafer metrology with a high throughput. For example, the FOV of the mSEM can be in the order of 100 micrometer×100 micrometer or even 120 micrometer×120 micrometer; whereas the FOV of a conventional scanning electron microscope may be in the order of 1 micrometer×1 micrometer. A resolution of each mSEM image may be in the order of 5 nm×5 nm.

By using the mSEM in the wafer alignment, it is possible to implement, both, fine alignment, as well as coarse alignment in one go. In particular, global and local features can be identified from an mSEM image, e.g., without implementing complementing optical images. This makes the wafer alignment robust and simplifies the wafer alignment. In further detail, it becomes possible to reduce a translational error otherwise encountered when using multiple imaging modalities that are not aligned uniaxial. The large FOV of the mSEM can be used for finding unique structures on the wafer, such as positioning markers or semiconductor structures or other wafer structures, and use such structures for wafer alignment. Further, the large FOV also ensures uniqueness, e.g., when used in conjunction with an image processing algorithm, such as feature recognition: typically, the context of repetitive structures of the wafer can be captured by such large FOV of the mSEM and thus ambiguities due to the repetitive character of the repetitive structures can be resolved. The high resolution of the mSEM allows precise alignment, by using small features of the structures.

Figure 1:
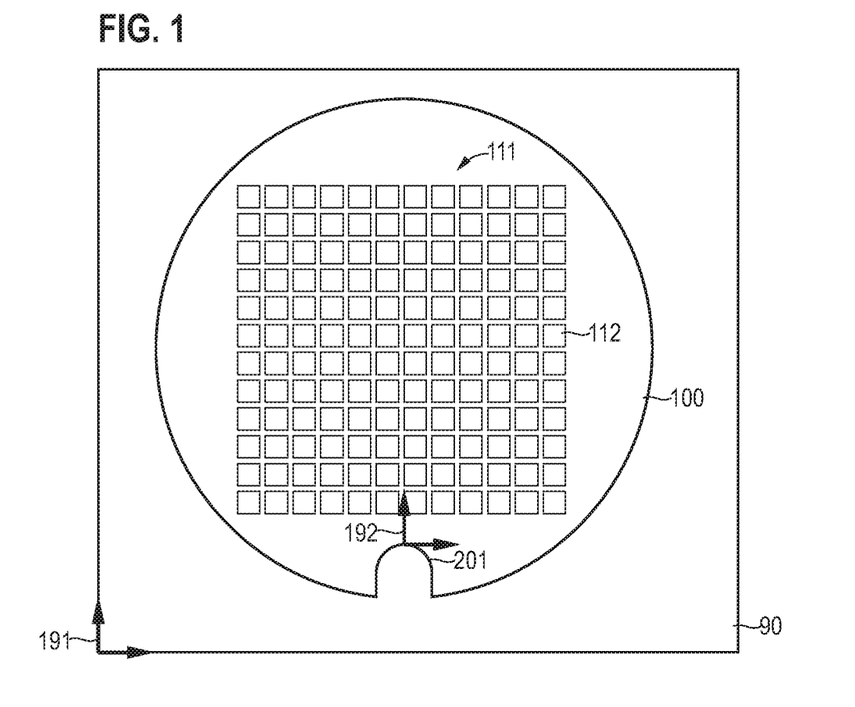
FIG. 1 schematically illustrates a wafer coordinate system and a stage coordinate system according to various examples.

FIG. 1 schematically illustrates aspects with respect to a stage coordinate system 191 and a wafer coordinate system 192. The stage coordinate system 191 is associated with a motorized wafer handling stage 90 (hereinafter, simply stage).

A wafer 100 is attached to the stage 90. The wafer 100 includes an array 111 of semiconductor dies 112. The array 111 defines a repetitive order of the semiconductor dies 112. The wafer 100 also includes a notch 201 that, together with the center of the wafer 100, defines the wafer coordinate system 192 (in the example of FIG. 1, the wafer coordinate system 192 is defined by the lateral dimensions; the vertical dimension—perpendicular to the drawing plane of FIG. 1—is not illustrated).

While in the example of FIG. 1 the origin of the wafer coordinate system 192 is aligned with the notch 201, in other examples, the origin of the wafer coordinate system 192 could be arranged otherwise, e.g., with respect to the center or another reference position of the wafer 100.

Hereinafter, techniques of wafer alignment are described. Wafer alignment denotes the process of registering the wafer coordinate system 192 to the stage coordinate system 191.

After the wafer 100 is mounted to the stage 90, the arrangement of the wafer coordinate system 192 with respect to the stage coordinate system 191 is not known or, at least not known at an accuracy desirable for fabrication or metrology. For example, there could be a rotation of the primary axis of the wafer coordinate system 192 in the lateral plane with respect to the primary axis of the stage coordinate system 191. Also, it would be possible that the lateral primary axes of the wafer coordinate system 192 are tilted out of the lateral plane of the stage coordinate system 191 (i.e., the wafer surface is tilted out of the mounting surface of the stage 90 due to non-planar mounting), to give just a few examples that could result in differences between the stage coordinate system 191 and the wafer coordinate system 192. The impact of such differences can be compensated based on the wafer alignment, by registering the wafer coordinate system 192 to the stage coordinate system 191. A coordinate transformation can be determined between the wafer coordinate system 192 and the stage coordinate system 191, and/or vice versa.

Sometimes, in addition to the stage coordinate system 191 and the wafer coordinate system, a die coordinate system may be used. Also, the die coordinate system may be registered to the stage coordinate system as part of the wafer alignment. Details with respect to the die coordinate system described in connection with FIG. 2.

Figure 2:
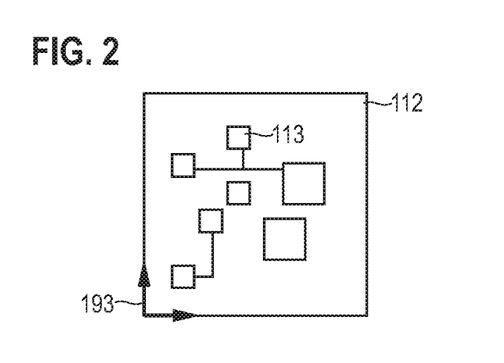
FIG. 2 schematically illustrates a die coordinate system according to various examples.

FIG. 2 schematically illustrates aspects with respect to a die coordinate system 193. The die coordinate system 193 is associated with a semiconductor die 112 of the array 111. In particular, each semiconductor die 112 of the array 111 may have its own associated die coordinate system 193. The position of one or more semiconductor structures 113 within each semiconductor die 112 may be defined with respect to the respective die coordinate system 193. The semiconductor dies 112 may be repetitive, i.e., each semiconductor die 112 can include the same arrangement of the same one or more semiconductor structures 113.

As a general rule, each semiconductor die 112 may have a respective die coordinate system 193 defined with respect to a corresponding origin situated a reference position of the respective semiconductor die 112, e.g., at a corner or center thereof. The multiple die coordinate systems 193 could be transformed into each other by translational shifts between the respective reference positions of the multiple semiconductor dies 112.

Sometimes, the die coordinate systems 193 are also labeled local coordinate systems, because they define the local position of the semiconductor structures 113 within each one of the dies 112; likewise, the wafer coordinate system 192 is sometimes referred to as global coordinate system, because it globally—i.e., on wafer level of the wafer 100—defines the position of the dies 112 of the array 111.

According to various examples, it is possible to register the die coordinate systems 193 of the semiconductor dies 112 to the stage coordinate system 191, e.g., as part of the wafer alignment. This can include finding the appropriate reference positions for each semiconductor die 112.

For example, it is then possible to position the stage 90—by appropriately controlling the motor thereof—such that a selected one of the semiconductor structures 113 is in the center of the FOV of a respective imaging modality (having a FOV aligned with the stage 90). Then, wafer inspection can be performed.

As a general rule, a typical lateral length scale of the semiconductor structures 113 can be in the order of nanometers to ten nanometers or a few tens of nanometers. A typical lateral length scale of the semiconductor dies 112 can be in the order of a few tens of micrometers to 100 micrometers, i.e., at least a factor of 1,000 larger than the typical length scale of the semiconductor structures 113. Therefore, by using the mSEM, it is possible to have a sufficiently large resolution to image details of each semiconductor structure 113, as well as having a sufficiently large FOV to image a significant fraction of a semiconductor die 112. This facilitates coarse alignment and fine alignment.

Wafer alignment as discussed herein may be employed for in-line metrology during manufacturing of semiconductor structures. An example for such a manufacturing of semiconductor structures as an application environment for various embodiments is illustrated in FIG. 3.

Figure 3:
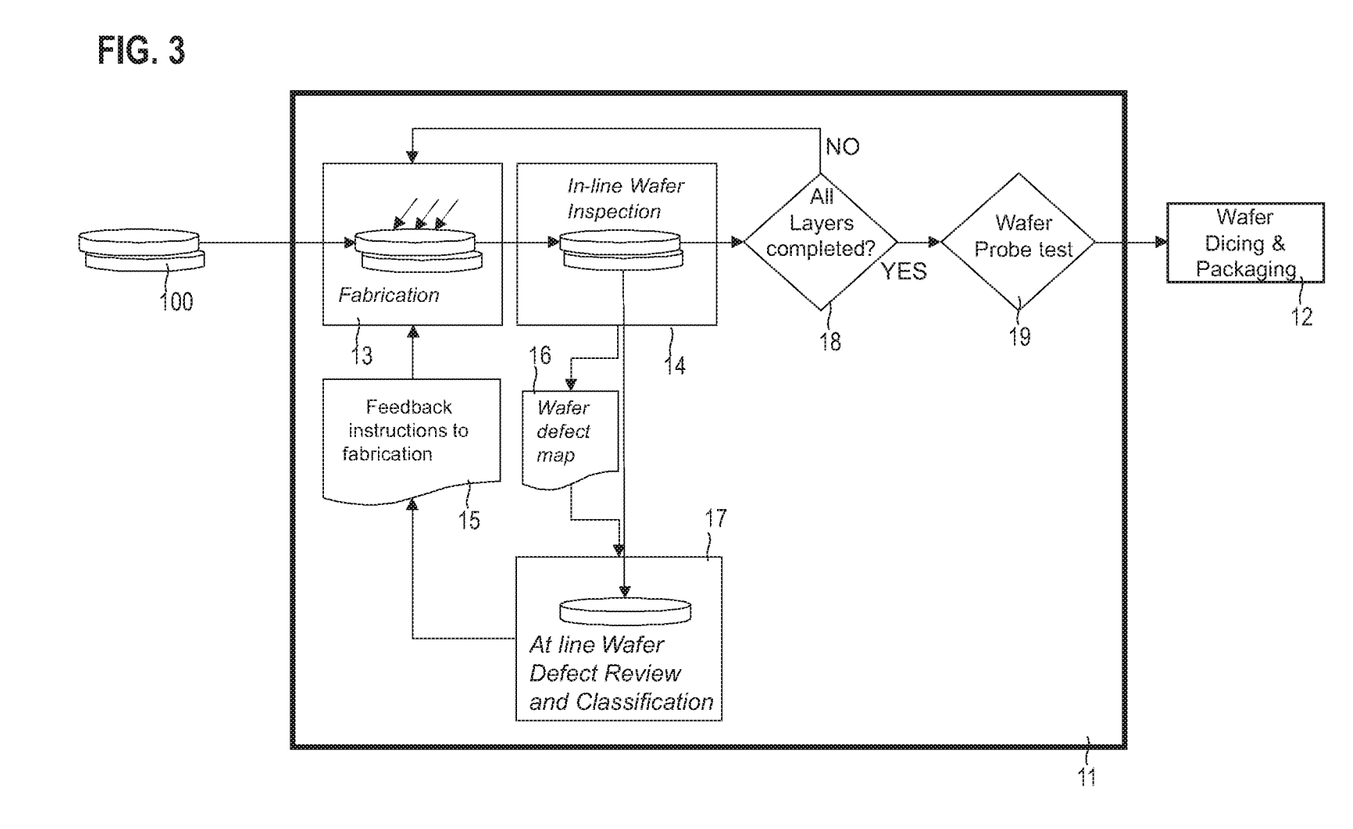
FIG. 3 schematically illustrates wafer fabrication and wafer inspection according to various examples.

In FIG. 3, the manufacturing of semiconductor structures starts with blanc wafers 100. Example for such wafers include silicon wafers or gallium arsenide wafers, but any semiconductor wafers may be used.

First, the wafers 100 are subjected to a so-called front-end processing 11. Front-end processing relates to all processing steps where structures are formed on the wafer before the structures on the wafers are mechanically separated from each other (release). For mass production, of a plurality of equal structures is formed on the wafers, which are then separated into separate semiconductor structures.

The front-end processing 11 includes a plurality of fabrication steps 13. Such fabrication steps 13 may include etching, layer deposition of semiconductor layers or metal layers, diffusion or implantation, for example for doping, cleaning, wafer planarization, resist coating and resist treatment, lithography exposure etc. With these fabrication steps 13, structures are formed on wafers 100—e.g., the array 111 of semiconductor dies (cf. FIG. 1).

After certain fabrication steps 13, the wafers are subjected to in-line metrology/wafer inspection 14. In addition or alternatively to in-line metrology 14, measurements may be performed "in situ," i.e. during one or more of the fabrication steps 13.

For the wafer inspection, methods and devices as explained above and further explained below are used to perform wafer alignment. The wafer inspection may include various measurements of physical parameters such as film thickness, film uniformity, detection of particles or contaminations or measuring electrical parameters, like resistance or capacitance. By using metrology, dimensions of structures formed on the wafer can be determined by obtaining an image of the wafer. Images may be taken at well-defined positions of the wafer because the wafer coordinate system 192 (and, optionally, the die coordinate systems 193) are registered to the stage coordinate system 191. Optionally, it would be possible to obtain a defect map 16 of the wafer, i.e. to obtain information where on the wafer structures have not been formed as desired. The defect map can be defined the wafer coordinate system 192. The determination of the presence or absence of defects may be carried out by comparing the image data to data previously gathered for a similar section of another object (die-to-die), or it may be carried out by comparison to a corresponding portion of a reference database (die-to-database) or a design data (die-to-CAD). All data may be handled and controlled in databases, including defect databases forming a collection of representative defects, CAD databases collecting information about ideal or representative structures, and process recipes.

These measurements for wafer inspection during the fabrication steps 13 or at in-line wafer inspection 14 may be performed directly on product wafers, i.e. on wafers intended to manufacture semiconductor structures for sale, either directly or using specific test structure, or alternatively on specific non-functional monitor wafers (also referred to as dummy wafers). Specifically designed test structures are also known as process control monitors (PCMs).

When defects are detected, the wafers 100 where the defects are detected may be provided to an at-line wafer defect review and classification 17. "At-line" indicates that the wafers 100 in this case are taken out of the usual production process for further inspection. In particular, in the review and classification 17, the locations identified in wafer defect map may be reviewed in order to verify and classify the indications of process variations or defects. Images may be taken at well-defined positions of the wafer 100, because the wafer coordinate system 192 (and, optionally, the die coordinate systems 193) are registered to the stage coordinate system 191. Thus, the stage 90 can be moved to the appropriate position for a respective imaging modality.

As a result, feedback instructions 15 to the fabrication may be given, for example to modify fabrication parameters to count the process variations, or also instructions for example to do maintenance due to possible defect components in a corresponding fabrication device.

This repeats until at check 18 it is determined that all layers of the processing are completed. Following this, wafer probe testing 19 may be performed, where for example structures on the wafer are contacted electrically by probes to perform test measurements.

After the front-end processing 11, back-end processing 12 follows where the wafers are diced into separate chips along die streets between alignment dies 112, and the chips are packaged. More testing of the semiconductor structures manufactured may occur during the back-end processing.

As will be appreciated from the above, metrology and wafer-inspection can rely on an accurate wafer alignment: because the FOV of an imaging modality used as part of the metrology is defined in the stage coordinate system 191, it is important to accurately register the wafer coordinate system 192 and, optionally, any die coordinate systems 193 to the stage coordinate system. This helps to later on be able to accurately identify a position of defects which can help to e.g. identify pass/fail of the respective wafer or also can help to identify a root cause of the associated defect. The techniques described herein facilitate such accurate wafer alignment. Details with respect to the accurate wafer alignment will be described next in connection with the following figures.

Figure 4:
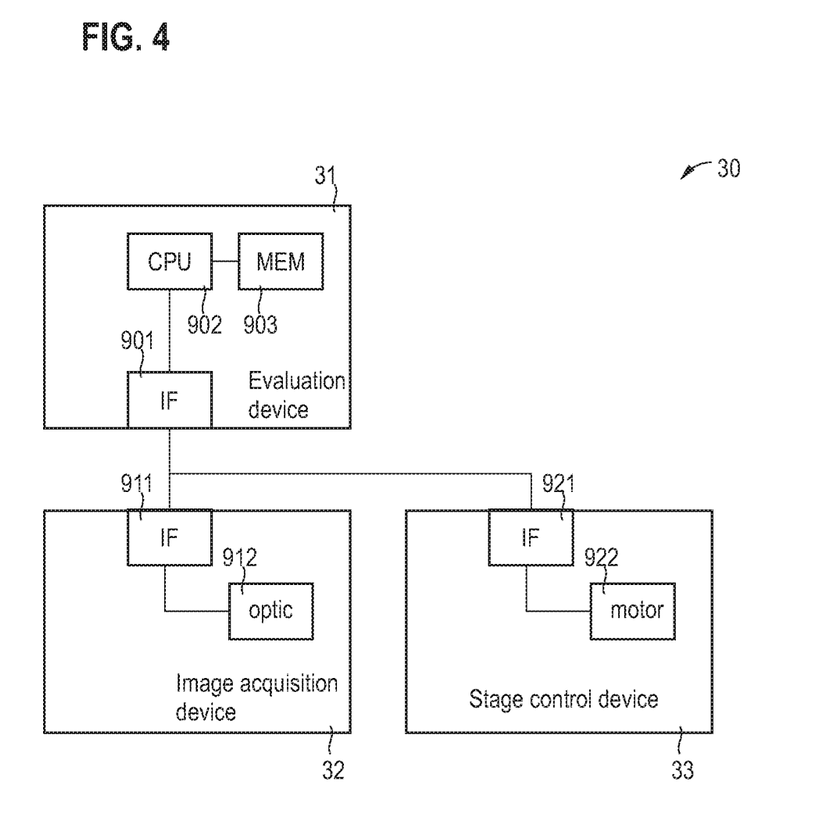
FIG. 4 schematically illustrates a system according to various examples.

FIG. 4 illustrates a system 30. The system 30 can be used for wafer alignment according to various examples. The system 30 includes a processing device 31, an image acquisition device 32, and a stage control device 33. The processing device 31, the image acquisition device 32, and the stage control device 33 each include a respective communication interface 901, 911, 921 and can communicate with each other via the communication interfaces 901, 911, 921.

While in FIG. 4 a scenario is illustrated in which a single image acquisition device 32 is used, sometimes multiple image acquisition devices may be used.

The image acquisition device 32 may be an optical image acquisition device using light of a short wavelength such as for spectroscopic metrology, metrology using x-rays such as an x-ray transmission or diffraction microscope, or a device using charged particles such as a scanning electron microscope or a focused ion beam microscope using electrons or other charged particles such as gallium or helium ions. These devices using charged particles are also collectively referred to as charged particle microscopes. One particular implementation of a charged particle microscope is an mSEM. Hereinafter, techniques will be described in connection with techniques in which the image acquisition device 32 is implemented as an mSEM. The mSEM provides a sufficiently high pixel density, i.e., a high resolution, to capture the smallest relevant detail, for example the smallest occurring defects or deviations from semiconductor structures 113. On the other hand, the mSEM provides a sufficiently large FOV to capture a spatial context of individual structures, e.g., by capturing multiple semiconductor structures 113 or significant sections/areas of a die 112 or multiple positioning markers. FIG. 4 illustrates optics 912 of the mSEM 32.

The stage control device 33 includes a motor 922 that can be used to reposition the stage 90, e.g., along the primary lateral axis of the stage coordinate system 191. The positioning accuracy can be in the submicrometer range.

The processing device 31 includes a processor 902 and a memory 903, both forming control circuitry. For example, the control circuitry can transmit control data to the stage control device 33, to thereby control the stage 90 to reposition the wafer 100. The control circuitry of the processing device 31 can also receive images from the optics 912 of the mSEM 32. For example, the control circuitry can be implemented to perform a feature recognition of features included in such images. The control circuitry can be configured to perform a wafer alignment by registering the wafer coordinate system 192 to the stage coordinate system 191, and optionally registering one or more of the die coordinate systems 193 to the stage coordinate system 191. Then, if a certain position on the wafer 100, e.g., a certain semiconductor structure 113 is to be positioned within the FOV of a given imaging modality for wafer inspection, the control circuitry can calculate the desired shift in the stage coordinate system 191 based on the relevant positions in the wafer coordinate system 192 and/or a respective die coordinate system 193. Then, the appropriate control data can be transmitted to the motor 922 of the stage control device 33.

Details with respect to the functioning of the system 30 are explained next in connection with FIG. 5.

Figure 5:
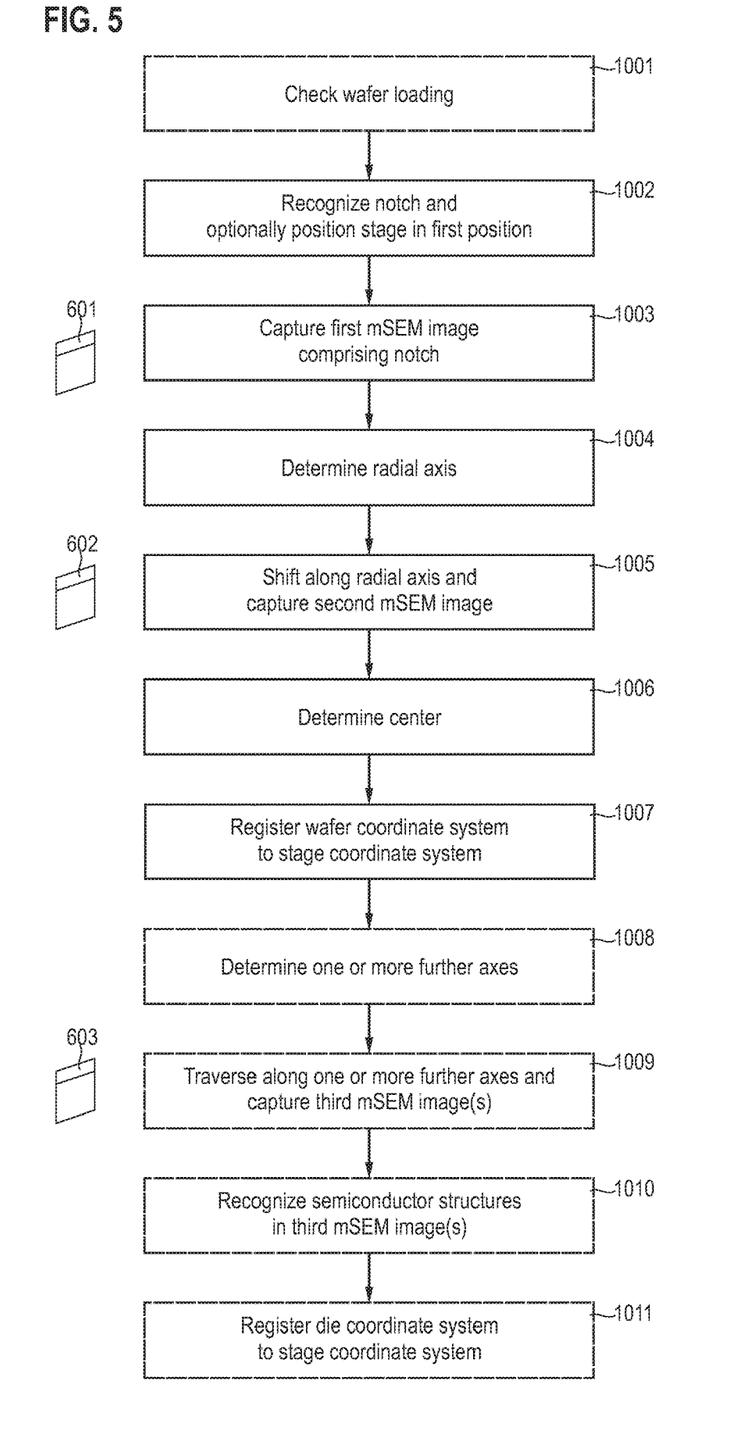
FIG. 5 is a flowchart of a method according to various examples.

FIG. 5 is a flowchart of a method according to various examples. For example, the method of FIG. 5 could be executed by the control circuitry of the processing device 31. For example, the method of FIG. 5 could be executed by the processor 902 upon loading program code from the memory 903.

At box 1001, a wafer loading check is implemented. For example, this can include checking whether a load dock has been closed and whether the wafer 100 has been appropriately attached to the stage 90. Box 1001 can also include initializing the stage 90, e.g., by positioning the stage 90 at an initializing position defined within the stage coordinate system 191.

When executing box 1001, the wafer coordinate system 192 is not aligned with the stage coordinate system 191. Hence, an accuracy with which the center position of a FOV of the mSEM 32 on the wafer 100 is known is low, i.e., magnitudes lower than a typical structure size of the semiconductor structures 113. Typically, an alignment accuracy without specific wafer alignment process (i.e., based on mechanical alignment when attaching the wafer 100 to the stage 90) is worse than 100 micrometers and limited by manual handling accuracy or loading tool accuracy.

Figure 6:
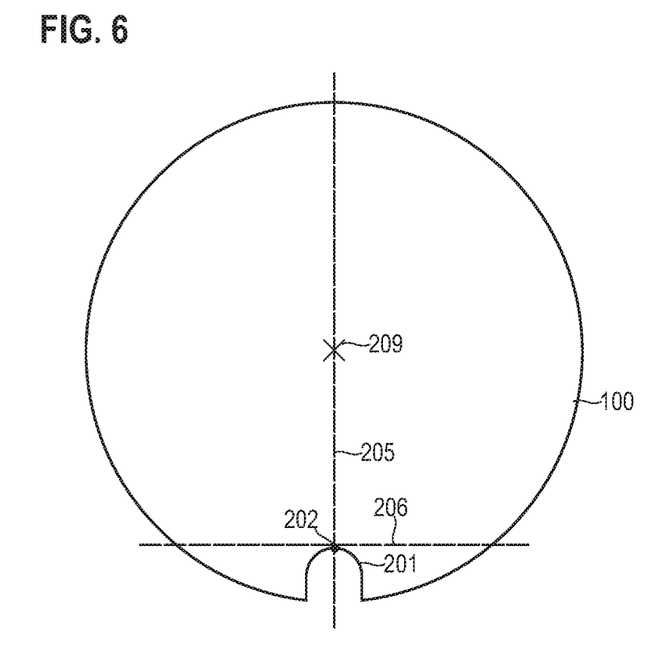
FIG. 6 schematically illustrates a notch and a center of a wafer according to various examples.
Figure 7:
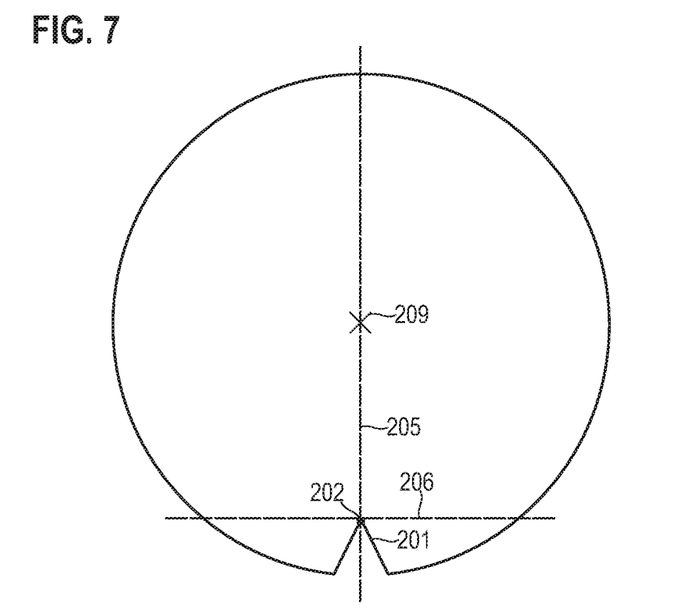
FIG. 7 schematically illustrates a notch and a center of a wafer according to various examples.

In box 1002, an optical microscope is used to identify the notch 201 of the wafer 100. This can be used for coarse alignment such that a FOV of the mSEM 32 is centered on a saddle point 202 of the notch 201 (example saddle points 202 are illustrated in FIG. 6 and FIG. 7).

Accordingly, in box 1002, it is possible to control the optical microscope to capture an optical image of the wafer 100 and to then recognize the notch 201 in the optical image. It is then possible to control the stage 90 to traverse to a first position, based on the recognizing of the notch and based on a predefined alignment of the FOV of the mSEM and the stage coordinate system 191. The FOV of the mSEM can be centered on the saddle point 202 of the notch 201 when the stage 90 is in the first position. For example, a computer-implemented feature recognition algorithm may be used.

The predefined alignment of the FOV of the mSEM and the stage coordinate system 191 may be defined by the fixed mechanical pose of the mSEM optics 912 to the stage 90.

s Next, at box 1003, the mSEM 32 can be controlled to capture a first image 601 of the wafer 100, while the stage 90 is in the first position. This first image 601 includes at least a part of the notch 201. In particular, the first image 601 can include/image the saddle point 202 of the notch 201.

The saddle point 202 can then be used to determine a radial axis 205 (cf. FIG. 6 and FIG. 7), see box 1004. More generally speaking, the radial axis 205—intersecting the notch 201 and a center 209 of the wafer 100—can be determined based on the first image captured with the mSEM 32.

For example, a tangent 206 to the notch 201 could be determined based on the saddle point 202 and it would then be possible to determine the radial axis 205 to be orthogonal to the tangent 206. The radial axis 205 could also be determined as a symmetry axis of the notch 201.

As a general rule, the tangent 206 and the radial axis 205 can be parallel to the primary axes of the wafer coordinate system 192. Thus, box 1004 can help to determine an orientation of the wafer coordinate system 192.

Once the radial axis 205 has been determined, next, at box 1005, the stage 90 is controlled to shift the wafer 100 along this radial axis 205 by half a diameter of the wafer 100. The diameter of the wafer 100 can be a-priori knowledge. Wafer sizes are typically standardized, e.g., to 150 mm or 300 mm in diameter.

Also, any offset perpendicular to the radial axis 205 can be compensated at box 1005.

Then, after traversing along the radial axis 205, the stage 90 is positioned in a second position. While the stage 90 is in the second position, the mSEM 32 is controlled to capture one or more second images 602 of the wafer 100.

The second image includes a reference position of the wafer 100. The reference position of the wafer 100 can correspond to the center 209 of the wafer 100 (cf. FIG. 6 and FIG. 7). In other examples, the reference position can also have a certain predefined offset with respect to the center 209. Hereinafter, for sake of simplicity, it is assumed that the reference position corresponds to the center 209; but in other examples, other reference positions may be used.

The one or more second images 602 include wafer structures arranged at or around the center 209. Examples of such wafer structures are: die street; positioning markers; semiconductor structures 113, corners of semiconductor dies 112; etc. The relative distances of such wafer structures to the center 209 may be known, e.g., from a reference database or design data. It is thus possible to determine the center 209 of the wafer 100 in the second image 602 based on a structure recognition of the device structures in the one or more second images. As a general rule, the structure recognition can be computer-implemented using an appropriate structure recognition algorithm.

Then, it would be possible to determine any stretching/skewing of the wafer coordinate system 192 with respect to the stage coordinate system 191, e.g., based on a comparison between the actual distance between the saddle point 202 and the center 209, and the travelled distance of the stage 90.

Thus, once the center 209 of the wafer 100 has been determined (or, more specifically, once the position of the center 209 in the second image 602 has been determined), the wafer coordinate system 192 is registered to the stage coordinate system 191, based on the center 209 and the radial axis 205. For example, a rotation between the wafer coordinate system 192 and the stage coordinate system 191 can be determined based on the alignment of the radial axis 205. It would be possible to identify any stretching or compression of distances in the wafer coordinate system 102 versus distances in the stage coordinate system 191 by comparing a travel distance between the first position and the second position of the stage 90 with a nominal distance between the saddle point 202 and the center 209. For example, a transformation matrix may be obtained that transforms the wafer coordinate system 192 into the stage coordinate system 191, or vice versa. These are just a few examples on how to implement the registering of the wafer coordinate system 192 to the stage coordinate system 191. Other implementations are conceivable. The general techniques of wafer alignment are known and can be re-used here.

Figure 8:
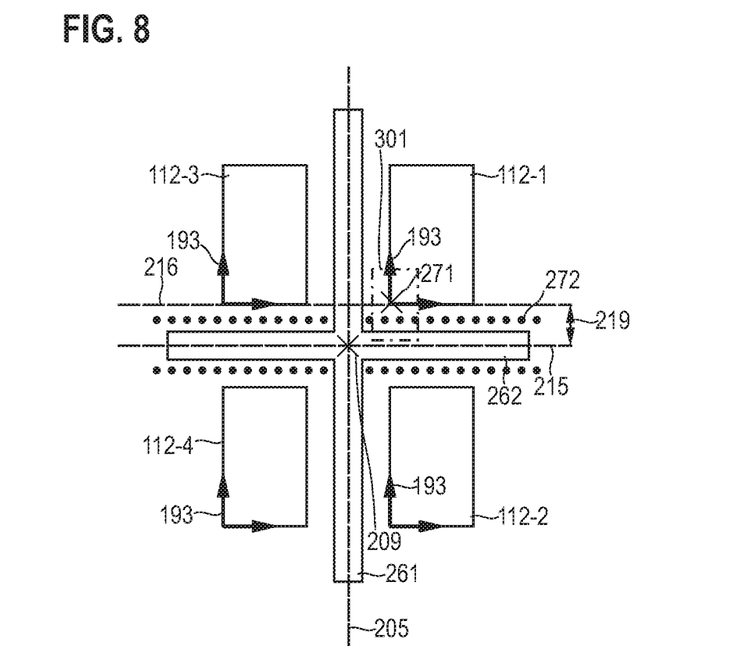
FIG. 8 schematically illustrates semiconductor dies around a center of the wafer according to various examples.

Details with respect to determining the center 209 in box 1006 are illustrated in connection with FIG. 8. FIG. 8 is a schematic illustration of the wafer 100 at and around the center 209. In particular, adjacent semiconductor dies 112-1-112-4 are illustrated. There are orthogonal die streets 261-262 in between the adjacent semiconductor dies 112-1-112-4. In between the die streets 261-262 and the semiconductor dies 112-1-112-4, there are positioning markers 272. The positioning markers 272 can have a repetitive arrangement, as illustrated in FIG. 8. The position of the center 209 in the second image 602 can be determined by performing a structure recognition of the orthogonal die streets 261-262 and then identifying the center of the respective intersection between the orthogonal die streets 261-262, thereby determining the center 209. For example, the die streets 261-262 can be recognized based on test structures within the die streets 261-262 (the test structures are not illustrated in FIG. 8), and/or based on adjacent positioning markers 272.

Referring again to FIG. 5: as a result of executing box 1007, the wafer alignment is obtained. Sometimes, it can be desirable to also include a registration of one or more die coordinate systems 193 to the stage coordinate system 191. Then, the next boxes 1008-1010 can be executed. Another reason for executing boxes 1008-1010 can be to increase an accuracy of the registration of the wafer coordinate system 192 to the stage coordinate system 191.

At box 1008, one or more further axes of the wafer 100 are determined. This can be based on the wafer coordinate system 192. Since there is an initial registration available (from box 1007), it is also possible to control the stage 90 to traverse along the one or more further axes at box 1009. While traversing along the one or more further axis, the mSEM 32 is controlled to capture one or more third images 603 (the stage 90 can stop when capturing the one or more third images 603). The third images 603 include the semiconductor structures 113 of the dies 112. It is possible to recognize the semiconductor structures 113 in box 1010 (i.e., to determine the position of the semiconductor structures 113 in the third images 603 using structure recognition) and then register, in box 1011, the accordingly defined die coordinate system 193 to the stage coordinate system 191. Again, any shifts or translations can be identified by a deviation between (i) the actually travelled distance between the center 209 and the dies 112-1-112-4 and semiconductor structures 113, and (ii) the nominal distance, e.g., obtained from a CAD or database.

Details with respect to these further axes are also illustrated in connection with FIG. 8. In particular, FIG. 8 illustrates a first example implementation of such a further axis 215 and a second example implementation of such a further axis 216. The further axis 215 is a radial axis intersecting the center 209. The axis 215 is aligned with the die street 262 and, thus, orthogonal to the radial axis 205. In another example, it would also be possible to determine the further axis 216 which has an offset 219 if compared to the axis 215. For example, the offset 219 could be determined based on a width of the die streets 261, 262, or—more generally—based on a distance between adjacent semiconductor dies 112-1-112-4. The width of the die streets 261, 262 correlates with the distance between the adjacent semiconductor dies 112-1-112-4. Accordingly, it is possible that the FOV 301 of the mSEM 32 is then aligned with the corners 271 of the semiconductor dies 112-1, 112-3 when traversing along the further axis 216. Thus, better coverage of the semiconductor structures 113 within the semiconductor dies can be obtained when using the offset further axis 216. This is because the FOV 301 of the mSEM is typically in the same order of magnitude as the width of the die streets 261, 262, e.g., is in the order of 60% to 140% of the width of the offset 219, as illustrated in FIG. 8. It is possible to capture the multiple third images for multiple adjacent semiconductor dies 112-1, 112-3 arranged along the further axis 215, 216. Then, the repetitive semiconductor structures 113 of the adjacent semiconductor dies can be recognized in the multiple third images, e.g., by comparing the multiple third images with each other. And used for wafer alignment.

Then, the particular position of each die 112-1-112-4 can be determined. This can be used for registering the respective die coordinate systems 193 to the stage coordinate system 191 and/or to the wafer coordinate system 192. Also, the accuracy of the registration of the wafer coordinate system 192 to the stage coordinate system 191 could be increased.

Summarizing, above techniques of wafer alignment have been described. Pre-alignment using an optical microscope is used. Subsequent steps associated with the wafer alignment do not rely on the use of an optical microscope; but rather use mSEM images. Such techniques have the advantage that offsets due to the non-uniaxial arrangement of optical microscopes and other imaging modalities such as limited-FOV SEM are avoided. The techniques can be implemented fast and reliable.

Accordingly, scenarios and examples according to the following CLAUSEs have been described.

CLAUSE 1. A method, including:
controlling a multi-scanning electron microscope, mSEM (32), to capture a first image (601) of a wafer (100) attached to a motorized handling stage (90) while the motorized handling stage (90) is in a first position, the first image (601) including at least a part of a notch (201) of the wafer (100),
determining a radial axis (205) of the wafer (100) based on the first image (601),
controlling the motorized handling stage (90) to shift the wafer (100) along the radial axis (205) by half a diameter of the wafer (100), so that the motorized handling stage (90) is in a second position,
controlling the mSEM (32) to capture a second image (602) of the wafer (100) while the motorized handling stage (90) is in the second position, the second image (602) including wafer structures (112, 112-1-112-4, 113, 261, 262, 272),
determining a reference position (209) of the wafer (100) based on a structure recognition of the wafer structures (112, 112-1-112-4, 113, 261, 262, 272) of the second image (602), and
registering a wafer coordinate system (192) of the wafer (100) to a stage coordinate system (191) of the motorized handling stage (90) based on the reference position (209) and the radial axis (205).

CLAUSE 2. The method of CLAUSE 1,
wherein the wafer structures subject to the structure recognition include orthogonal die streets (261, 262) in between adjacent semiconductor dies (112, 112-1-112-4).

CLAUSE 3. The method of CLAUSE 1 or 2,
wherein the wafer (100) includes an array of semiconductor dies (112, 112-1-112-4),
wherein the method further includes:
determining one or more further axes (215, 216) of the wafer (100),
controlling the motorized handling stage (90) to traverse along the one or more further axes (215, 216),
controlling the mSEM (32) to capture one or more third images (603) while traversing along the one or more further axes (215, 216), the one or more third images (603) including semiconductor structures (113) of the semiconductor dies of the array,
determining the semiconductor structures (113) based on a further structure recognition in the one or more third images (603), and
registering die coordinate systems (193) of the semiconductor dies (112, 112-1-112-4) to the stage coordinate system (191) based on the the recognizing.

CLAUSE 4. The method of CLAUSE 3,
wherein the one or more further axes include an axis (216) having an offset (219) with respect to a center radial axis (215).

CLAUSE 5. The method of CLAUSE 4,
wherein the offset (219) is determined based on a width of die streets (261, 262) between adjacent semiconductor dies (112, 112-1-112-4) of the array.

CLAUSE 6. The method of CLAUSE 4 or 5, wherein a field of view (301) of the mSEM (32) is in a range of 60% to 140% of the offset (219).

CLAUSE 7. The method of any one of CLAUSEs 4 to 6,
wherein multiple third images (603) are captured for multiple adjacent semiconductor dies (112, 112-1-112-4) of the array adjacent to each other along the one or more further axes (215, 216),
wherein the semiconductor structures (113) are determined in the multiple third images (603) by comparing the multiple third images (603) with each other.

CLAUSE 8. The method of any one of the preceding CLAUSEs,
wherein the first image (601) includes a saddle point (202) of the notch (201),
wherein the radial axis (205) of the wafer (100) is determined based on the saddle point (202).

CLAUSE 9. The method of any one of the preceding CLAUSEs, further including:
controlling an optical microscope to capture an optical image of the wafer (100),
recognizing the notch (201) in the optical image, and
controlling the motorized handling stage (90) to traverse to the first position based on the recognizing of the notch (201) and based on a predefined alignment of a field of view of the mSEM and the stage coordinate system (191).

CLAUSE 10. A processing device (31) including control circuitry (902, 903) configured to:
control a multi-scanning electron microscope, mSEM (32), to capture a first image (601) of a wafer (100) attached to a motorized handling stage (90) while the motorized handling stage (90) is in a first position, the first image (601) including at least a part of a notch (201) of the wafer (100),
determine a radial axis (205) of the wafer (100) based on the first image (601),
control the motorized handling stage (90) to shift the wafer (100) along the radial axis (205) by half a diameter of the wafer (100), so that the motorized handling stage (90) is in a second position,
control the mSEM (32) to capture a second image (602) of the wafer (100) while the motorized handling stage (90) is in the second position, the second image (602) including wafer structures (112, 112-1-112-4, 113, 261, 262, 272),
determine a reference position (209) of the wafer (100) based on a structure recognition of the wafer structures (112, 112-1-112-4, 113, 261, 262, 272) of the second image (602), and register a wafer coordinate system (192) of the wafer (100) to a stage coordinate system (191) of the motorized handling stage (90) based on the reference position (209) and the radial axis (205).

CLAUSE 11. The processing device (31) of CLAUSE 10, wherein the control circuitry (902, 903) is configured to perform the method of any one of CLAUSEs 1 to 9.

CLAUSE 12. A system (30), including the processing device (31) of CLAUSE 10 or 11 and the mSEM (32).

Although the disclosure has been shown and described with respect to certain preferred embodiments, equivalents and modifications will occur to others skilled in the art upon the reading and understanding of the specification. The present disclosure includes all such equivalents and modifications and is limited only by the scope of the appended claims. As an example, while certain implementations have been illustrated with respect to automated feature recognition, in some examples feature recognition may be implemented manually.

What is claimed is:

1. A method, comprising:
controlling a multi-scanning electron microscope, mSEM, to capture a first image of a wafer attached to a motorized handling stage while the motorized handling stage is in a first position, the first image comprising at least a part of a notch of the wafer;
determining a radial axis of the wafer based on the first image;
controlling the motorized handling stage to shift the wafer along the radial axis by half a diameter of the wafer so that the motorized handling stage is in a second position;
controlling the mSEM to capture a second image of the wafer while the motorized handling stage is in the second position, the second image comprising wafer structures;
determining a reference position of the wafer based on a structure recognition of the wafer structures of the second image; and
registering a wafer coordinate system of the wafer to a stage coordinate system of the motorized handling stage based on the reference position and the radial axis.

2. The method of claim 1, wherein the wafer structures subject to the structure recognition comprise orthogonal die streets between adjacent semiconductor dies.

3. The method of claim 1, wherein:
the wafer comprises an array of semiconductor dies; and
the method further comprises:
determining a further axis of the wafer;
controlling the motorized handling stage to traverse along the further axis;
controlling the mSEM to capture a third image while traversing along the further axis, the third image comprising semiconductor structures of the semiconductor dies of the array;
determining the semiconductor structures based on a further structure recognition in the third image; and
registering die coordinate systems of the semiconductor dies to the stage coordinate system based on the further structure recognition.

4. The method of claim 3, wherein the further axis comprises an axis having an offset with respect to a center radial axis.

5. The method of claim 4, further comprising determining the offset on a width of die streets between adjacent semiconductor dies of the array.

6. The method of claim 5, wherein a field of view of the mSEM is from 60% to 140% of the offset.

7. The method of claim 6, wherein:
the method further comprises capturing multiple third images for multiple adjacent semiconductor dies of the array adjacent to each other along the further axis; and
determining the semiconductor structures in the multiple third images by comparing the multiple third images with each other.

8. The method of claim 4, wherein a field of view of the mSEM is from 60% to 140% of the offset.

9. The method of claim 4, wherein:
the method further comprises capturing multiple third images for multiple adjacent semiconductor dies of the array adjacent to each other along the further axis; and
determining the semiconductor structures in the multiple third images by comparing the multiple third images with each other.

10. The method of claim 1, further comprising determining the radial axis of the wafer based on a saddle point of the notch.

11. The method of claim 1, further comprising:
controlling an optical microscope to capture an optical image of the wafer;
recognizing the notch in the optical image; and
controlling the motorized handling stage to traverse to the first position based on the recognition of the notch and based on a predefined alignment of a field of view of the mSEM and the stage coordinate system.

12. The method of claim 1, wherein:
the wafer structures subject to the structure recognition comprise orthogonal die streets between adjacent semiconductor dies;
the wafer comprises an array of semiconductor dies; and
the method further comprises:
determining a further axis of the wafer;
controlling the motorized handling stage to traverse along the further axis;
controlling the mSEM to capture a third image while traversing along the further axis, the third image comprising semiconductor structures of the semiconductor dies of the array;
determining the semiconductor structures based on a further structure recognition in the third image; and
registering die coordinate systems of the semiconductor dies to the stage coordinate system based on the further structure recognition.

13. The method of claim 12, wherein the further axis comprises an axis having an offset with respect to a center radial axis.

14. The method of claim 13, further comprising determining the offset on a width of die streets between adjacent semiconductor dies of the array.

15. The method of claim 13, wherein a field of view of the mSEM is from 60% to 140% of the offset.

16. The method of claim 13, wherein:
the method further comprises capturing multiple third images for multiple adjacent semiconductor dies of the array adjacent to each other along the further axis; and
determining the semiconductor structures in the multiple third images by comparing the multiple third images with each other.

17. One or more machine-readable hardware storage devices, comprising:
instructions that are executable by one or more processing devices to perform operations comprising the method of claim 1.

18. A system, comprising:
one or more processing devices; and
one or more machine-readable hardware storage devices comprising instructions that are executable by the one or more processing devices to perform operations the method of claim 1.

19. A method, comprising:
controlling a multi-scanning electron microscope, mSEM, to capture a first image of a wafer attached to a motorized handling stage while the motorized handling stage is in a first position, the first image comprising at least a part of a notch of the wafer;
determining a radial axis of the wafer based on the first image;
controlling the motorized handling stage to shift the wafer along the radial axis so that the motorized handling stage is in a second position;
controlling the mSEM to capture a second image of the wafer while the motorized handling stage is in the second position, the second image comprising wafer structures;
determining a reference position of the wafer based on a structure recognition of the wafer structures of the second image; and
registering a wafer coordinate system of the wafer to a stage coordinate system of the motorized handling stage based on the reference position and the radial axis.

20. The method of claim 19, wherein controlling the motorized handling stage to shift the wafer along the radial axis comprises shifting the radial axis by less than a diameter of the wafer.

\* \* \* \* \*

UNITED STATES PATENT AND TRADEMARK OFFICE
CERTIFICATE OF CORRECTION

PATENT NO. : 10,901,391 B1  
APPLICATION NO. : 16/564453  
DATED : January 26, 2021  
INVENTOR(S) : Saraswatula et al.

Page 1 of 1

It is certified that error appears in the above-identified patent and that said Letters Patent is hereby corrected as shown below:

In the Specification

Column 1, Line 51, after "can" delete "u)";

Column 4, Line 53, after "the" delete "is";

Column 12, Line 54, before "Next," delete "s";

Column 16, Line 9, delete "the the" and insert -- the --.

Signed and Sealed this  
Twentieth Day of April, 2021

Drew Hirshfeld  
*Performing the Functions and Duties of the  
Under Secretary of Commerce for Intellectual Property and  
Director of the United States Patent and Trademark Office*